(12) United States Patent
Kakei et al.

(10) Patent No.: US 8,294,036 B2
(45) Date of Patent: Oct. 23, 2012

(54) ELECTRONIC COMPONENT AND ELECTRONIC COMPONENT MODULE

(75) Inventors: Shinichiro Kakei, Tokyo (JP); Kenji Horino, Tokyo (JP); Hitoshi Saita, Tokyo (JP); Yasunobu Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 394 days.

(21) Appl. No.: 12/410,699

(22) Filed: Mar. 25, 2009

(65) Prior Publication Data
US 2009/0242257 A1  Oct. 1, 2009

(30) Foreign Application Priority Data
Mar. 31, 2008  (JP) ................ P2008-090076

(51) Int. Cl.
*H05K 1/16* (2006.01)
*H05K 1/18* (2006.01)
(52) U.S. Cl. ..................... 174/260; 361/761
(58) Field of Classification Search ............. 174/260, 174/261, 250, 253, 255; 361/761, 762, 764; 29/459; 257/730
See application file for complete search history.

(56) References Cited

U.S. PATENT DOCUMENTS

| | | | | |
|---|---|---|---|---|
| 5,563,773 A | * | 10/1996 | Katsumata | 361/764 |
| 5,705,852 A | * | 1/1998 | Orihara et al. | 257/679 |
| 5,742,098 A | * | 4/1998 | Brunner | 361/759 |
| 6,853,074 B2 | * | 2/2005 | Kitae et al. | 257/730 |
| 7,154,188 B2 | * | 12/2006 | Ogata | 257/730 |
| 7,259,458 B2 | * | 8/2007 | Su et al. | 257/713 |
| 2002/0162687 A1 | * | 11/2002 | Akihiko | 174/262 |
| 2006/0255478 A1 | * | 11/2006 | Hagen et al. | 257/787 |
| 2007/0125575 A1 | | 6/2007 | Inui et al. | |
| 2010/0051328 A1 | * | 3/2010 | Tain et al. | 174/255 |

FOREIGN PATENT DOCUMENTS

| | | | |
|---|---|---|---|
| JP | 2003031733 A | * | 1/2003 |
| JP | A-2007-158186 | | 6/2007 |
| JP | A-2007-242851 | | 9/2007 |
| JP | A-2008-21980 | | 1/2008 |

OTHER PUBLICATIONS

Attached Machine Translation of Nakayama (JP 2003031733A).*

* cited by examiner

*Primary Examiner* — Timothy Thompson
*Assistant Examiner* — Roshn Varghese
(74) *Attorney, Agent, or Firm* — Oliff & Berridge, PLC

(57) ABSTRACT

In a dielectric element, the side faces are roughened so that the surface roughness Ra is 15 nm or greater. By this means, the area of contact between a glass epoxy resin substrate and insulating material is increased, adhesion with resin substrates is improved, and strength and reliability can be enhanced when buried between two resin substrates. In the dielectric element, the surface roughness Ra of side surfaces is 5000 nm or less, so that when burying the dielectric element between a glass epoxy resin substrate and insulating material, the occurrence of air bubbles between the surface of the dielectric element and the resin can be prevented.

11 Claims, 6 Drawing Sheets

| CUTTING CONDITIONS | AVERAGE ROUGHNESS (nm) |
|---|---|
| DICING(#3000 METAL) | 11 |
| DICING(#2700 METAL) | 15 |
| DICING(#2000 METAL) | 20 |
| DICING(#1300 METAL) | 110 |
| DICING(#500 METAL) | 520 |
| DICING(#500 METAL)+ETCHING FOR 1 MINS | 1200 |
| DICING(#500 METAL)+ETCHING FOR 2 MINS | 3000 |
| DICING(#500 METAL)+ETCHING FOR 6 MINS | 5000 |
| DICING(#500 METAL)+ETCHING FOR 10 MINS | 7000 |

Fig. 6

| CUTTING CONDITIONS | AVERAGE ROUGHNESS (nm) | RELIABILITY EVALUATION |
|---|---|---|
| DICING(#3000 METAL) | 11 | × |
| DICING(#2700 METAL) | 15 | △ |
| DICING(#2000 METAL) | 20 | ○ |
| DICING(#1300 METAL) | 110 | ○ |
| DICING(#500 METAL) | 520 | ○ |
| DICING(#500 METAL)+ETCHING FOR 1 MINS | 1200 | ○ |
| DICING(#500 METAL)+ETCHING FOR 2 MINS | 3000 | ○ |
| DICING(#500 METAL)+ETCHING FOR 6 MINS | 5000 | △ |
| DICING(#500 METAL)+ETCHING FOR 10 MINS | 7000 | × | n=5

ELECTRONIC COMPONENT AND ELECTRONIC COMPONENT MODULE

BACKGROUND OF THE INVENTION

1. Field of the Invention

This invention relates to an electronic component and to an electronic component module, and in particular relates to an electronic component which is buried so as to be sandwiched between two resin substrates, and to an electronic component module in which the electronic component is buried so as to be sandwiched between two resin substrates.

2. Related Background Art

In order to accommodate the reduction in size and thickness and the higher mounting densities of wiring substrates (package substrates) in recent years, it has been proposed that in addition to IC components, capacitors, resistors, and other chip components be incorporated within substrates. Possible advantages of burying chip components and other electronic components in substrates include increased substrate mounting area, and the ability to manufacture electronic component modules and other electronic circuit substrates with high added value while remaining the same thickness and size. And, by burying capacitors and similar, the wiring length to other active elements can be shortened, so that the occurrence of unwanted electromagnetic radiation can be suppressed, and declines in signal and power transmission velocity can be suppressed, so that high-performance electronic circuit substrates can be manufactured.

For example, in Japanese Patent Application Laid-open No. 2007-242851, a multilayer substrate with incorporated components is disclosed which is a multilayer substrate with incorporated components in which a stacked member, in which multiple layers of circuit substrates having circuits formed on substrate insulating material are stacked, incorporates at least one type of active components such as semiconductor ICs; by making the substrate insulating material, on which circuits are formed connecting the components, a polyimide film the average linear expansion coefficient (CTE) in the range 100° C. to 350° C. of which is in the range −5 (ppm/° C.) to +20 (ppm/° C.), warping due to stacking of different materials, and separation of components and circuits, are prevented.

However, electronic components buried in a substrate as described above must be of low height, or formed on extremely thin foil, in order to enable burial in the substrate. For this reason the areas of the side-face adhesion portions of capacitors and other electronic components are small, and there is the problem of adhesion of the side faces of electronic components with the substrate. Further, when burying electronic components in resin or similar, a gap may be formed between a side face of an electronic component and the resin. When for example solder reflow or similar is used to mount ICs on the substrate, because the substrate is subjected to thermal cycles, so that the substrate expands and contracts, and so abnormal stresses may be concentrated at such gaps, giving rise to problems of strength and reliability.

SUMMARY OF THE INVENTION

This invention was devised in light of the above circumstances, and provides an electronic component and an electronic component module which improve adhesion with a substrate and enhance strength and reliability upon burying between two resin substrates.

An electronic component of one aspect of this invention is buried so as to be sandwiched between a first resin substrate and a second resin substrate, comprises a mounting face which faces the first resin substrate, an opposing face which opposes the mounting face and faces the second resin substrate, and at least one pair of side faces which intersect with the mounting face and the opposing face, and is characterized in that the surface roughness Ra of at least a portion of the side faces is in the range 15 nm$\leq$Ra$\leq$5000 nm.

According to this configuration, at least a portion of the side faces is roughened so that the surface roughness Ra is 15 nm or greater, and so the area of contact with the resin substrates is increased, adhesion with the resin substrates is improved, and upon burial between two resin substrates, strength and reliability can be enhanced. Further, because the surface roughness Ra of the side faces is 5000 nm or less, when burying the electronic component between the resin substrates, the occurrence of air bubbles between the electronic component surface and the resin can be prevented.

In this case, a surface roughness Ra for at least a portion of the side faces of 20 nm$\leq$Ra$\leq$3000 nm is preferable.

According to this configuration, at least a portion of the side faces is roughened so that the surface roughness Ra is 20 nm or greater, and so the area of contact with the resin substrates is increased, and adhesion with the resin substrates can be further improved. Further, because the surface roughness Ra of the side faces is 3000 nm or less, when burying the electronic component between the resin substrates, the occurrence of air bubbles between the electronic component surface and the resin can be further prevented.

Further, the electronic component may have a supporting substrate. The supporting substrate may be a metal foil of Cu, Ni, or Al, or a metal foil comprising one or more of these metals. The supporting substrate may comprise a structure having a metal electrode layer of Cu, Ni, Al, or a noble metal, or a metal electrode layer comprising one or more of these metals, on a Si or ceramic substrate.

This electric component enables enhancement of the adhesion between side faces of the electronic component and the resin substrates, and so is particularly advantageous when the supporting substrate is a metal foil of Cu, Ni, or Al, or a metal foil comprising one or more of these metals, or when the supporting substrate comprises a structure having a metal electrode layer of Cu, Ni, Al, or a noble metal, or a metal electrode layer comprising one or more of these metals on a Si or ceramic substrate, insofar as the difference in thermal expansion coefficients of such metals with resin is large.

It is preferable that the thickness between the mounting face and the opposing face be between 1 μm and 1000 μm.

According to this configuration, the electronic component is thin, with a thickness of 1 μm to 1000 μm, so that an electronic component module in which electronic components of this invention are buried can be designed to have a low height and high integration density.

Further, an electronic component module comprises the electronic component, which is buried so as to be sandwiched between a first resin substrate and a second resin substrate.

According to the electronic component and electronic component module, adhesion with substrates can be improved, and upon burial between two resin substrates, strength and reliability can be enhanced.

BRIEF DESCRIPTION OF THE DRAWINGS

FIG. 5 is a table showing the relation between cutting conditions and the surface roughness of side surfaces when dicing dielectric elements in experimental examples; and FIG. 6 is a table showing the relation between cutting conditions, the surface roughness of side surfaces, and reliability evaluations when dicing dielectric elements in experimental examples.

DESCRIPTION OF THE PREFERRED EMBODIMENTS

Figure 1:
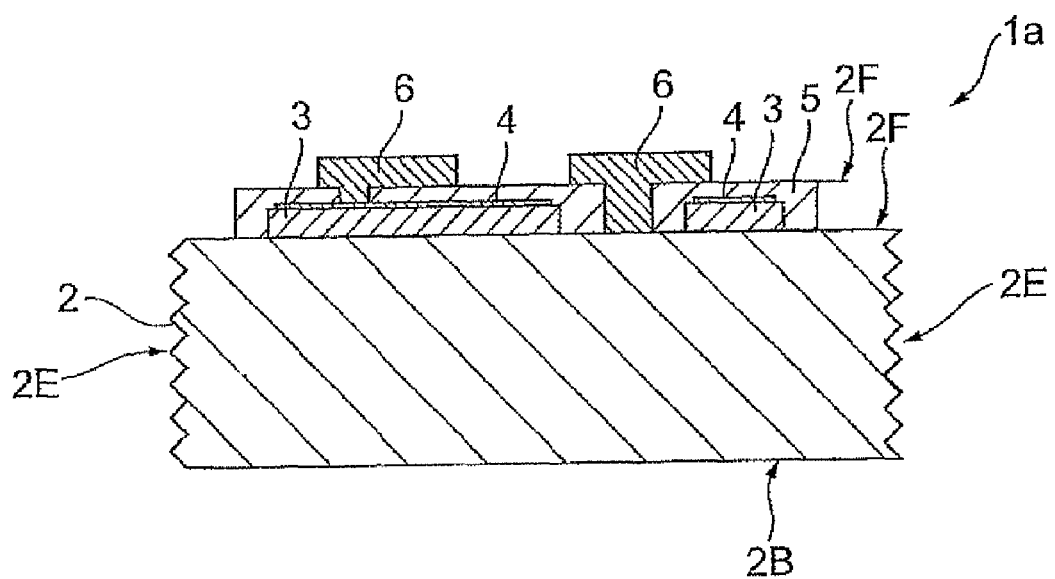
FIG. 1 is a summary cross-sectional view showing the structure of the dielectric element of an aspect.

Below, embodiments are explained in which an electronic component of the invention is configured as a dielectric element. FIG. 1 is a summary cross-sectional view showing the structure of the dielectric element 1a of this aspect. The dielectric element 1a shown in FIG. 1 is configured as a thin film capacitor, buried so as to be sandwiched between a glass epoxy resin substrate (first resin substrate) and an insulating material (second resin substrate), and overall has a thin film shape with four edges.

As shown in FIG. 1, the dielectric element 1a has a metal foil 2 of Ni serving as a lower metal layer, a dielectric film 3 provided on the surface 2F' of the metal foil 2, and an upper electrode 4 provided on the upper face of the dielectric film 3. On the upper face of the upper electrode 4 is provided an insulating film 5. In order to draw out the upper electrode 4 from the insulating film 5, a terminal electrode 6, penetrating the insulating film 5, is provided on a portion of the upper face of the upper electrode 4. Another terminal electrode 6 is connected to the metal foil 2, also serving as a lower electrode, via a through-hole which penetrates the insulating film 5.

The metal foil 2 may be metal foil of another common metal which is inexpensive and has low resistance, and may for example be metal foil of Cu or Al, or metal foil comprising at least one among the metals Ni, Cu, Al. Moreover, a structure may be employed having a metal electrode layer of Cu, Ni, Al, or a noble metal, or a metal electrode layer comprising at least one of these types of metals, on a Si or ceramic substrate. Also, the dielectric film 3 can be formed from material comprising one or more types among Bi, Ba, Sr, Ca, Ti, Zr, Hf, Ta, and Nb, and can for example be formed from $BaTiO_3$.

As shown in FIG. 1, the dielectric element 1a overall has a bottom face (mounting face) 2B facing the glass epoxy resin substrate, and a top face (opposing face) 2F facing the insulating material. The thickness between the bottom face and the top face is 1 μm to 1000 μm, and more preferably is 1 μm to 500 μm. The dielectric element 1a comprises two pairs of side faces 2E which intersect the bottom face 2B and top face 2F. In this aspect, the surfaces of the side faces 2E are roughened to a surface roughness Ra of 15 nm≦Ra≦5000 nm, and more preferably to 20 nm≦Ra≧3000 nm.

Figure 2:
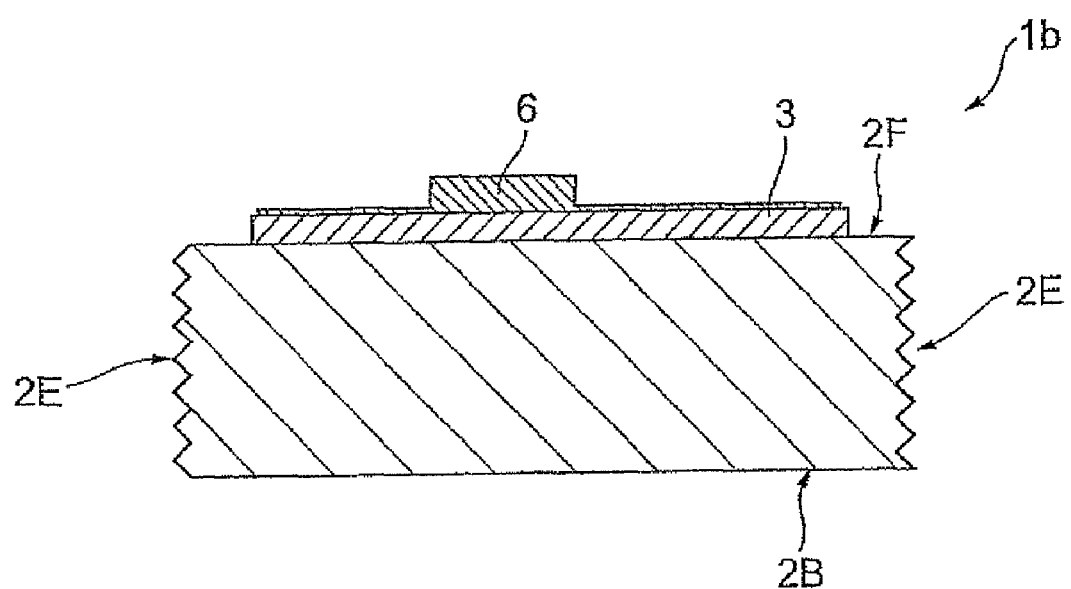
FIG. 2 is a summary cross-sectional view showing another structure of the dielectric element of an aspect.

FIG. 2 shows another structure of the dielectric element of an aspect. As shown in FIG. 2, in the dielectric element 1b the dielectric film 3 need not be covered by an insulating film 5, and moreover an upper electrode 4 need not be provided.

Below, a method of manufacture of the dielectric element 1a is explained. (a) through (j) in FIG. 3 are process diagrams showing a method of manufacture of dielectric elements of an aspect.

Figure 3:
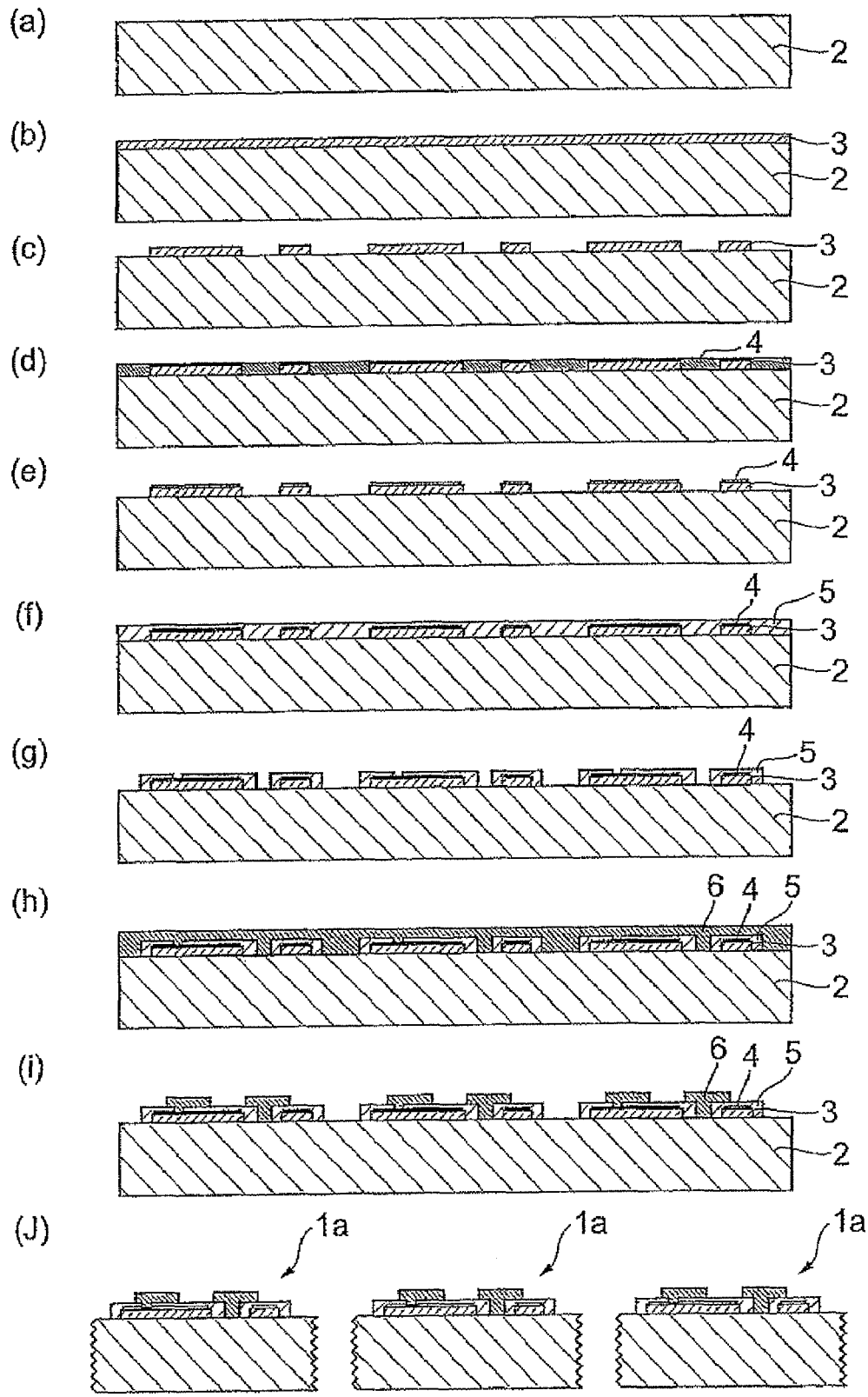
FIG. 3 is a process diagram showing a method of manufacture of the dielectric element of an aspect.

As shown in (a) of FIG. 3, metal foil 2, which is for example Cu foil or similar, is prepared. As shown in (b) of FIG. 3, sputtering or another method is used to deposit a dielectric film 3 of $BaTiO_3$ or similar. Then, heat treatment (annealing) is performed in an atmosphere in which Cu is not oxidized, to crystallize the dielectric film 3. As shown in (c) of FIG. 3, resist is applied onto the dielectric film 3, and exposure and development are performed to form a pattern; then, by etching the dielectric film 3 using a 3% hydrochloric acid aqueous solution or another etchant, patterning of the dielectric film 3 is performed.

As shown in (d) and (e) of FIG. 3, after stripping away the resist, a Cu film is deposited by sputtering as an upper electrode 4, and photolithography is used to perform patterning similarly to that of the dielectric film 3. As shown in (f) and (g) of FIG. 3, after applying polyimide or similar as an insulating film 5, photolithography is used to perform patterning similarly to that of the dielectric film 3, and a through-hole is formed to draw out leads from the upper electrode 4 and the metal foil 2 as the lower electrode. As shown in (h) and (i) of FIG. 3, after depositing Cu film by plating, photolithography is used to perform patterning similarly to that of the dielectric film 3, to form the terminal electrode 6.

As shown in (j) of FIG. 3, dicing is used to separate into dies. In this case, by selecting the type of dicing blade, the side faces 2E can be roughened so that the roughness Ra is in the range 15 nm≦Ra≦5000 nm, and more preferably 20 nm≦Ra≦3000 nm In this case, roughening can also be performed by performing etching of the side faces 2E after dicing.

Figure 4:
FIG. 4 is a process diagram showing a process of burying the dielectric element of an aspect in a substrate.
Figure 4:
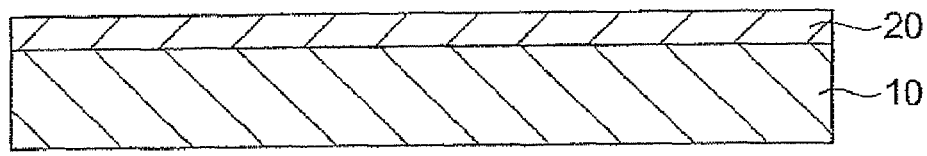
Figure 4:
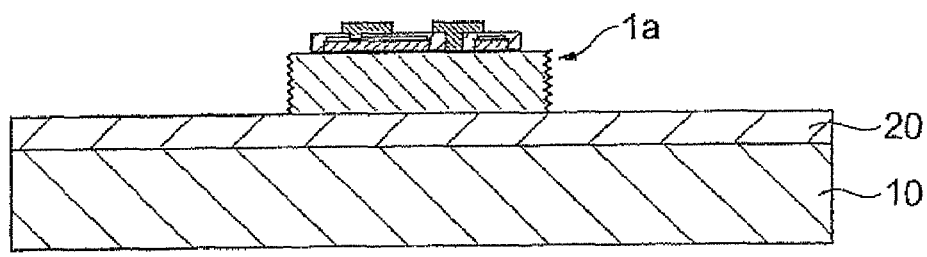
Figure 4:
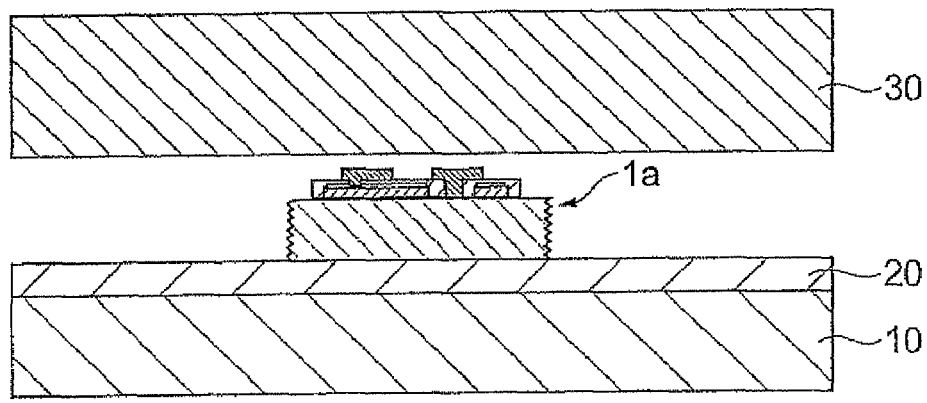
Figure 4:
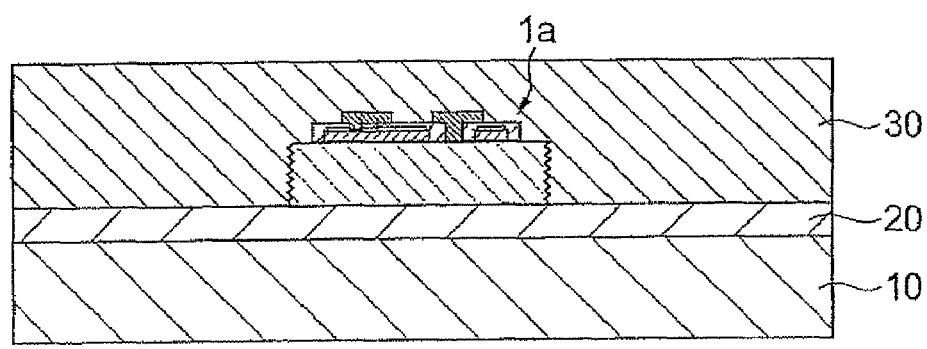

(a) through (e) in FIG. 4 are process diagrams showing processes for burial of the dielectric element of an aspect in a substrate. As shown in (a) of FIG. 4, a glass epoxy resin substrate (first resin substrate) 10 is prepared, and as shown in (b) of FIG. 4, unhardened-state resin 20, of B stage (indoors, in a state of thermal hardening through heating in the unhardened solid state) epoxy resin or similar, is formed. As shown in (c) of FIG. 4, the dielectric element 1b is mounted such that the bottom face 2B is facing the unhardened-state resin 20. As shown in (d) of FIG. 4, the dielectric element 1b is sandwiched between the glass epoxy resin substrate 10 and insulating material 30, such that the top surface 2F is facing the insulating material 30. As shown in (e) of FIG. 4, the unhardened-state resin 20 is heat-cured, the glass epoxy resin substrate 10 and the insulating material 30 are pressure-bonded by heat pressing, and the dielectric element 1b is buried.

According to this aspect, roughening is performed so that the surface roughness Ra of the side faces 2E is 15 nm or greater, so that the area of contact between the glass epoxy resin substrate 10 and the insulating material 30 is increased, adhesion with the resin substrates is improved, and the strength and reliability upon burial between the two resin substrates can be enhanced. Further, because the surface roughness Ra of the side faces 2E is 5000 nm or less, when burying dielectric elements 1a, 1b between a glass epoxy resin substrate 10 and insulating material 30, the occurrence of air bubbles at the surfaces of the dielectric elements 1a, 1b can be prevented.

In particular, according to this aspect, roughening is performed so that the surface roughness Ra of the side faces 2E is 20 nm or greater, so that the area of contact between the glass epoxy resin substrate 10 and insulating material 30 is made greater, and adhesion with the resin substrates can be further improved. Also, because the surface roughness Ra of the side faces 2E is 3000 nm or less, when burying dielectric elements 1a, 1b between the glass epoxy resin substrate 10 and insulating material 30, the occurrence of air bubbles between the surfaces of the dielectric elements 1a, 1b and the resin can be prevented.

On the other hand, in this aspect the adhesion between the side faces of an electronic component and the resin substrates can be enhanced, so that especially great advantages accrue when the metal foil portions of the dielectric elements 1a, 1b are metal foil of Cu, Ni, or Al, the difference in thermal expansion coefficients with the resin of which is large, or when the structure has metal foil comprising one or more types from among these metals, or when the structure has a metal electrode layer of Cu, Ni, Al, or a noble metal, or a metal electrode layer comprising one or more of these types of metals on a Si or ceramic substrate.

In addition, in this aspect the dielectric elements 1a, 1b are made thin, with thicknesses of 1 μm to 1000 μm, so that an electronic component module in which the dielectric elements 1a, 1b are buried can be designed to be of low height and with a high integration density.

Below, an experimental example of a dielectric element 1a of this aspect is explained. The dielectric element 1a shown in FIG. 1 was manufactured by the method shown in FIG. 3. The conditions were as follows.

Sample metal foil: Cu foil of thickness 200 μm
Dielectric film: $BaTiO_3$ film formed by sputtering
Annealing: Heat treatment at 850° C. for 20 minutes in an atmosphere with an $O_2$ partial pressure of 12 atm
Upper electrode: After formation of a Cu film by sputtering, photolithography used for patterning
Insulating film: After polyimide application, photolithography used for patterning
Terminal electrodes: After Cu film formation by sputtering, photolithography used for patterning
Separated capacitor size: 1 mm×0.5 mm When separating into dies, by selecting the type of dicing blade, the roughness Ra of the side faces 2E was adjusted. Also, roughening was performed by subjecting the side faces 2E to etching after dicing. FIG. 5 shows the relation between the cutting conditions in dicing and the side face roughness for dielectric elements of the experimental example. Surface roughness was measured using a DEKTAK (model name) manufactured by Sloan, with a probe force of 10 mg and scan length of 0.5 mm.

Dielectric element samples fabricated as described above were buried so as to be sandwiched between a glass epoxy resin substrate 10 and insulating material 30 as shown in FIG. 4.

Evaluation samples fabricated as explained above were evaluated in heat cycle tests. Reliability evaluations were performed under testing conditions in which samples were subjected to 1000 cycles of heating and cooling between −65° C. and 125° C. After tests, the glass epoxy resin substrate 10 and insulating material 30 were cut so as to pass through an incorporated dielectric element, the cross-section was observed using a microscope, and inspections for element warping and separation were performed. Results appear in FIG. 6.

As shown in FIG. 6, almost no separation was found for elements for which the surface roughness Ra of the side faces 2E was in the range 15 nm≦Ra≦5000 nm. In particular, when the surface roughness Ra of the side faces 2E was 20 nm≦Ra≦3000 nm, no separation at all was observed. On the other hand, separation was observed in the case of elements with a surface roughness Ra of the side faces 2E of less than 15 nm or of more than 5000 nm.

In the above, aspects of the invention were explained; however, this invention is not limited to the above aspects, and various modifications are possible.

What is claimed is:

1. An electronic component that includes a metal foil, a dielectric film provided on an upper face of the metal foil, an upper electrode provided on an upper surface of the dielectric film, an insulating film provided on an upper surface of the upper electrode so that the dielectric film and the upper electrode are covered with the insulting film, and an insulating material that covers the metal foil and the insulating film, the metal foil comprising:
   a mounting face which opposes the upper face; and
   at least one pair of side faces, which intersect with the mounting face and the upper face,
      wherein a surface roughness Ra of at least a portion of the side faces of the metal foil is in a range of 15 nm≦Ra≦5000 nm.

2. The electronic component according to claim 1, wherein the surface roughness Ra of at least a portion of the side faces of the metal foil is in a range of 20 nm≦Ra≦3000 nm.

3. The electronic component according to claim 1, wherein the metal foil is made of one or more of Cu, Ni, and/or Al.

4. The electronic component according to claim 1, wherein a thickness between the mounting face and the upper face is from 1 μm to 1000 μm.

5. The electronic component according to claim 1, the at least a portion of the side faces of the metal foil being in contact with the insulating material.

6. An electronic component module comprising:
   a first resin substrate;
   a second resin substrate; and
   an electronic component buried so as to be sandwiched between the first resin substrate and the second resin substrate, the electronic component comprising:
      a metal foil,
      a dielectric film provided on an upper face of the metal foil, the upper face faces the second resin substrate,
      an upper electrode provided on an upper surface of the dielectric film, and
      an insulating film provided on an upper surface of the upper electrode so that the dielectric film and the upper electrode are covered with the insulating film,
      the metal foil comprising:
         a mounting face which opposes the upper face and faces the first resin substrate; and
         at least one pair of side faces, which intersect with the mounting face and the upper face,
            wherein a surface roughness Ra of at least a portion of the side faces of the metal foil is in a range of 15 nm≦Ra≦5000 nm.

7. The electronic component module according to claim 6, wherein the surface roughness Ra of at least a portion of the side faces is in a range of 20 nm≦Ra≦3000 nm.

8. The electronic component module according to claim 6, wherein the metal foil is made of one or more of Cu, Ni and/or Al.

9. The electronic component module according to claim 6, wherein a thickness between the mounting face and the upper face is from 1 μm to 1000 μm.

10. The electronic component module according to claim 6, wherein the electronic component comprises a structure having a metal electrode layer on a Si or ceramic substrate, the metal electrode layer being made of one or more of Cu, Ni, Al and a noble metal.

11. The electronic component module according to claim 6, wherein at least a portion of the side faces of the metal foil is in contact with the second resin substrate.

* * * * *